(12) United States Patent
Taniguchi et al.

(10) Patent No.: US 9,423,470 B2
(45) Date of Patent: Aug. 23, 2016

(54) MAGNETIC POLARITY DETERMINATION DEVICE, PERMANENT MAGNET SYNCHRONOUS MOTOR CONTROL DEVICE, AND MAGNETIC POLARITY DETERMINATION METHOD

(71) Applicant: Kabushiki Kaisha Toshiba, Tokyo (JP)

(72) Inventors: Shun Taniguchi, Tokyo (JP); Kazuya Yasui, Tokyo (JP); Kazuaki Yuuki, Saitama (JP); Yosuke Nakazawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 13/927,750

(22) Filed: Jun. 26, 2013

(65) Prior Publication Data

US 2014/0009147 A1 Jan. 9, 2014

(30) Foreign Application Priority Data

Jun. 27, 2012 (JP) ................................. 2012-144651

(51) Int. Cl.
    *G01R 33/028* (2006.01)
(52) U.S. Cl.
    CPC .................... *G01R 33/028* (2013.01)
(58) Field of Classification Search
    CPC ....... G01R 33/028; G01R 31/06; H02P 21/00
    USPC ....................................................... 324/258
    See application file for complete search history.

(56) References Cited

U.S. PATENT DOCUMENTS

| 5,432,644 A * | 7/1995 | Tajima et al. ............... 360/99.04 |
| 2002/0171389 A1* | 11/2002 | Nakazawa ..................... 318/811 |
| 2012/0235609 A1* | 9/2012 | Ide et al. ................... 318/400.02 |

FOREIGN PATENT DOCUMENTS

| JP | 3401155 | 8/1998 | |
| JP | 3719910 | 12/2001 | |
| JP | 2008-079489 | 4/2008 | |
| WO | WO 2011077829 A1 * | 6/2011 | ................ H02P 6/18 |

* cited by examiner

*Primary Examiner* — Son Le
*Assistant Examiner* — Brent J Andrews
(74) *Attorney, Agent, or Firm* — Patterson & Sheridan, LLP

(57) ABSTRACT

A control system for controlling a synchronous motor having a magnet in a rotor includes an inverter configured to output an AC current for driving the motor, a gate command generating unit configured to generate a gate command for controlling the inverter, a current detecting unit configured to detect the AC current output by the inverter, a magnetic pole position estimating unit configured to estimate a magnetic pole position based on the AC current detected by the current detecting unit and generate an estimation signal, a current command generating unit configured to generate a current command and an estimation command for controlling the inverter to output an AC current with a predetermined level, and a magnetic polarity determination unit configured to determine the polarity of the magnet based on the estimation signal.

8 Claims, 12 Drawing Sheets

(ROTOR SIDE)

ROTOR SIDE

STATOR SIDE

MAGNETIC POLARITY DETERMINATION DEVICE, PERMANENT MAGNET SYNCHRONOUS MOTOR CONTROL DEVICE, AND MAGNETIC POLARITY DETERMINATION METHOD

CROSS-REFERENCE TO RELATED APPLICATION

This application is based upon and claims the benefit of priority from Japanese Patent Application No. 2012-144651, filed Jun. 27, 2012, the entire contents of which are incorporated herein by reference.

FIELD

Embodiments described herein relate generally to a magnetic polarity determination device, a permanent magnet synchronous motor control device, and a magnetic polarity determination method.

BACKGROUND

A sensorless control device of a permanent magnet synchronous motor needs to estimate the magnetic pole direction because the position of the magnetic pole at the time of starting a rotor from a stop state of the rotor is estimated using the magnetic saliency of the rotor. Methods that employ magnetic saturation to estimate the magnetic pole direction have been proposed.

In the estimation methods of the related art, the magnetic pole direction is estimated based on the assumption that the inductance in the magnetic flux direction of a magnet decreases monotonically with respect to an increase in the current in the N-pole direction. Consequently, this technology cannot be applied if the inductance in the magnetic flux direction of the magnet has a maximum point and does not decrease monotonically with respect to an increase in the current in the N-pole direction.

DETAILED DESCRIPTION

The objective of the present embodiment is to solve this problem by providing a magnetic polarity determination device, a permanent magnet synchronous motor control device, and a magnetic polarity determination method, which can estimate the magnetic pole direction even for a motor whose inductance in the magnetic flux direction of the magnet with respect to increase of the current in the N-pole direction has a maximum point.

In general, according to one embodiment, a magnetic polarity determination device is used to determine the magnetic polarity of a permanent magnet synchronous motor having a magnet that generates a magnetic flux, wherein the magnetic flux is varied in response to a current flowing in one of first and second directions, the magnetic flux being increased in response to the current flowing in the first direction and decreased in response to the current flowing in the second direction. The magnetic polarity determination unit is configured to detect an increase (or a decrease) in an inductance in the magnetic pole direction with respect to a reference inductance, in response to currents with the same prescribed current value flowing in opposite directions, and to determine the current flow direction that causes the increase (or the decrease) as an N-pole side direction.

Next, the embodiment will be explained in detail with reference to the drawings.

(First Embodiment)

Figure 1:
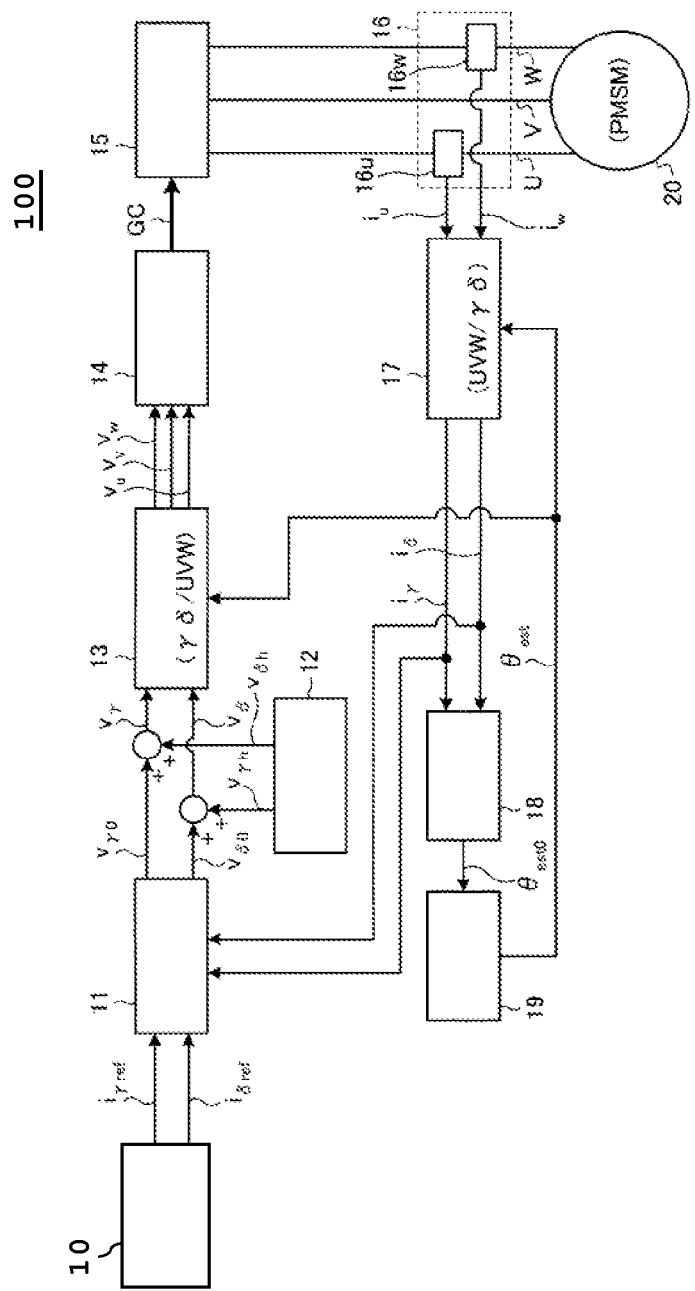
FIG. 1 is a block diagram of a control device of a permanent magnet synchronous motor of a first embodiment.

FIG. 1 is a block diagram illustrating a control device of a permanent magnet synchronous motor according to a first embodiment.

A motor driving device 100 roughly includes a current command generating unit 10, a current control unit 11, a high-frequency voltage superimposition unit 12, a first coordinate converting unit 13, a triangular wave PWM modulation unit 14, an inverter 15, a current detecting unit 16, a second coordinate converting unit 17, a magnetic pole position estimating unit 18, and a magnetic polarity determination unit 19.

In the configuration described above, the current control unit 11, the high-frequency voltage superimposition unit 12, the first coordinate converting unit 13, the triangular wave PWM modulation unit 14, the current detecting unit 16, the second coordinate converting unit 17, the magnetic pole position estimating unit 18, and the magnetic polarity determination unit 19 jointly function as an inverter control unit.

The current command generating unit 10 generates a magnetic flux current command signal $i_{\gamma ref}$ and a torque current command signal $i_{\delta ref}$. When estimating a magnetic polarity, the current command generating unit 10 controls the inverter 15 based on the magnetic flux current command signal $i_{\gamma ref}$ and the torque current command signal $i_{\delta ref}$.

The current control unit 11 outputs fundamental voltage command signals v$\gamma$0, v$\delta$0 based on the magnetic flux current command signal $i_{\gamma ref}$ and the torque current command signal $i_{\delta ref}$ as well as a magnetic flux current component signal i$\gamma$ and a torque current component signal i$\delta$ input from an external rotation control device.

The high-frequency voltage superimposition unit 12 superimposes high-frequency voltage command signals v$\gamma$h, v$\delta$h with the fundamental voltage command signals v$\gamma$0, v$\delta$0 to generate voltage command signals v$\gamma$, v$\delta$ and outputs them to the first coordinate converting unit 13.

The first coordinate converting unit 13 performs $\gamma\delta$-UVW conversion to the voltage command signals v$\gamma$, v$\delta$ based on a polarity-attached magnetic pole position $\theta$est to generate voltage command signals vu, vv, vw and outputs them to the triangular wave PWM modulation unit 14.

The triangular wave PWM modulation unit 14 generates a gate command signal (group) GC used for driving a switching transistor (for example, IGBT: Insulated Gate Bipolar Transistor), not shown in the drawing, that constitutes the inverter 15 based on the input voltage command signals vu, vv, vw and outputs it to the inverter 15.

Based on the gate command signal GC, the inverter 15 generates a U-phase signal U, a V-phase signal V, and a W-phase signal W used in driving a permanent magnet synchronous motor (PMSM) 20. Then, based on the generated U-phase signal U, V-phase signal V, and W-phase signal W, the inverter 15 converts a DC power into an AC power by turning on/off an incorporated switching element (for example, IGBT).

The current detecting unit 16 uses current sensors 16$u$ and 16$w$ to detect a U-phase current iu supplied to the permanent magnet synchronous motor 20 corresponding to the U-phase signal U and a W-phase current iw supplied to the permanent magnet synchronous motor 20 corresponding to the W-phase signal W and outputs them to the second coordinate converting unit 17. In this embodiment, current values (current response values) of two phases, that is, a U phase and a W phase are detected. However, it is also possible to adopt a configuration that detects current values of three phases.

The second coordinate converting unit 17 performs UVW-$\gamma\delta$ conversion to the input U-phase current iu and W-phase current iw based on the polarity-attached magnetic pole position $\theta$est to generate the magnetic flux current component signal i$\gamma$ and the torque current component signal i$\delta$ and outputs them to the magnetic pole position estimating unit 18 and the current control unit 11.

The magnetic pole position estimating unit 18 estimates the magnetic pole position of the permanent magnet synchronous motor 20 from the magnetic flux current component signal i$\gamma$ (current response value) and the torque current component signal i$\delta$ (current response value) input from the second coordinate converting unit 17.

In one example, to estimate the magnetic pole position, the current is passed through a band-pass filter, and a value corresponding to a magnetic pole position error is calculated. The calculated error is input into a PI controller to estimate the angular velocity. The angular velocity is integrated to estimate the magnetic pole position. It is also possible to calculate the magnetic pole position directly from the high-frequency current.

Namely, the magnetic pole position estimating unit 18 estimates the magnetic pole position based on the input magnetic flux current component signal i$\gamma$ and torque current component signal i$\delta$, and outputs a magnetic pole position estimation signal est 0 to the magnetic polarity determination unit 19.

Since the magnetic saliency of a rotor is used to estimate the magnetic pole position, the direction of the magnetic pole cannot be estimated. The magnetic pole position may be derived in the direction shifted by 180° (deg). It is thus necessary to determine the magnetic pole direction.

The magnetic polarity determination unit 19 generates the polarity-attached magnetic pole position $\theta$est based on the input magnetic pole position estimation signal $\theta$est 0 and outputs it to the first coordinate converting unit 13 and the second coordinate converting unit 17. That is, the magnetic polarity determination unit 19 uses the occurrence of magnetic saturation of a rotor core to determine an N pole and an S pole. If the magnetic pole position estimated by the magnetic pole position estimating unit 18 is shifted by 180° (deg), the polarity-attached magnetic pole position $\theta$est corresponding to the magnetic polarity will be output as a value reversed by 180° (deg) from the magnetic pole position estimation signal $\theta$est 0.

In the following, the configuration of the permanent magnet synchronous motor 20 used in this embodiment will be described before explaining the operation of the motor driving device 100.

Figure 2:
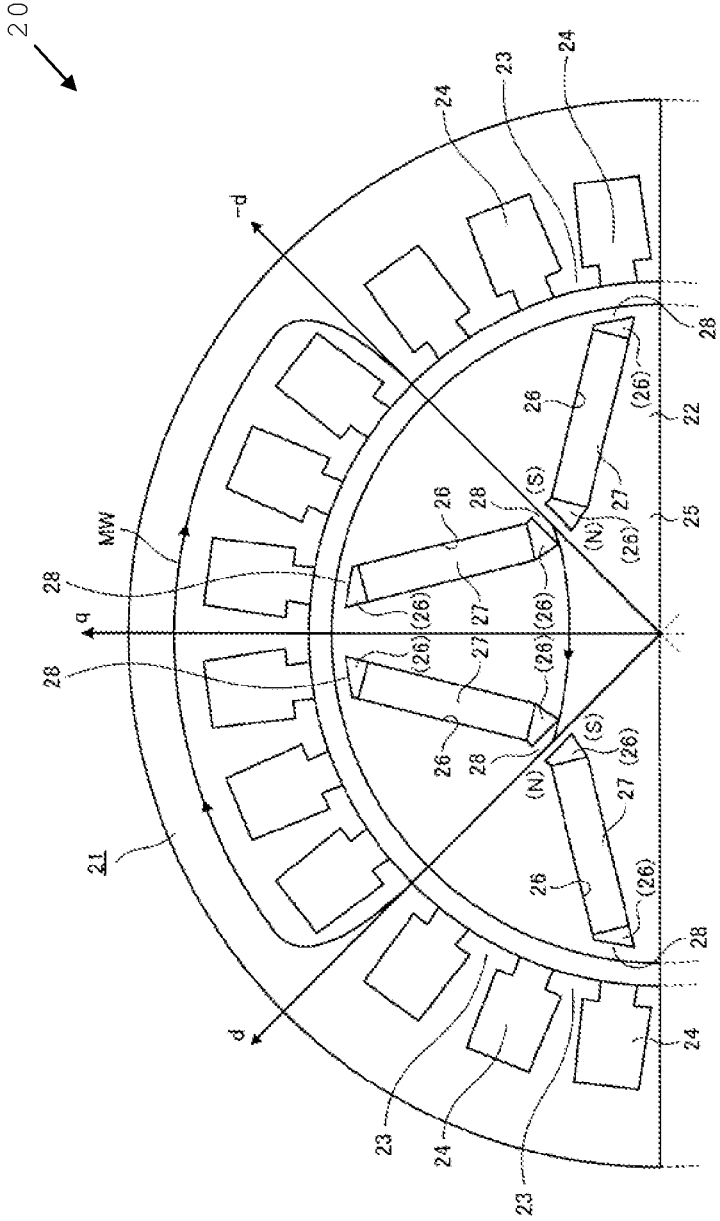
FIG. 2 is a longitudinal cross-sectional view illustrating the permanent magnet synchronous motor of the first embodiment.

FIG. 2 is a longitudinal cross-sectional view illustrating the overview configuration of the permanent magnet synchronous motor.

The motor generally includes a stator 21 and a rotor 22. In the permanent magnet synchronous motor 20, a magnetic field is generated by a 3-phase AC current flowing during each energization phase, and consequently a torque for rotating the rotor 22 is generated resulting from the magnetic interaction with the rotor 22.

The stator 21 is constituted by alternately disposing a stator teeth 23 and stator slots 24.

The rotor 22 has multiple vertical hole sections (gap sections) 26 disposed at prescribed positions of a rotor core 25 to isolate the magnetic poles from each other. At least one permanent magnet 27 is inserted and fixed in each vertical hole section 26 to form a magnetic pole at that position. Also, iron core parts 28 for magnetic path formation are disposed on the sides of the permanent magnet 27 to form a looped local magnetic path inside the rotor core 25.

First, the characteristic of the permanent magnet synchronous motor 20 will be explained.

In the following explanation, the N-pole direction of the magnetic pole is set as an axis d. Flowing of a positive current as a d-axis current means that the current flows in the direction that increases the magnetic flux of the magnet as far as the relationship between the inductance in the magnetic pole direction and the current is concerned.

A magnetic path MW of the axis d is as shown in FIG. 2. A d-axis inductance Ld is calculated according to the equation below from a variation $\Delta id$ of the d-axis current and a variation $\Delta\phi d$ of a d-axis magnetic flux.

$$L_d = \Delta\phi_d/\Delta i_d \qquad \text{Equation 1}$$

Figure 3:
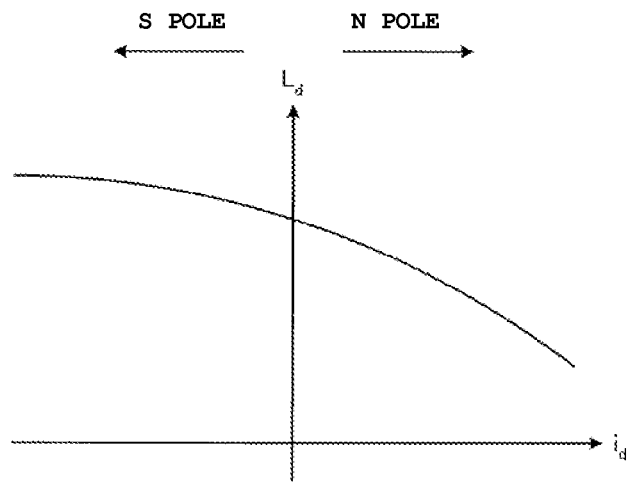
FIG. 3 is a diagram explaining the d-axis inductance characteristic for a general permanent magnet synchronous motor.

FIG. 3 is a diagram explaining the well-known d-axis inductance characteristic for a permanent magnet synchronous motor.

Figure 4:
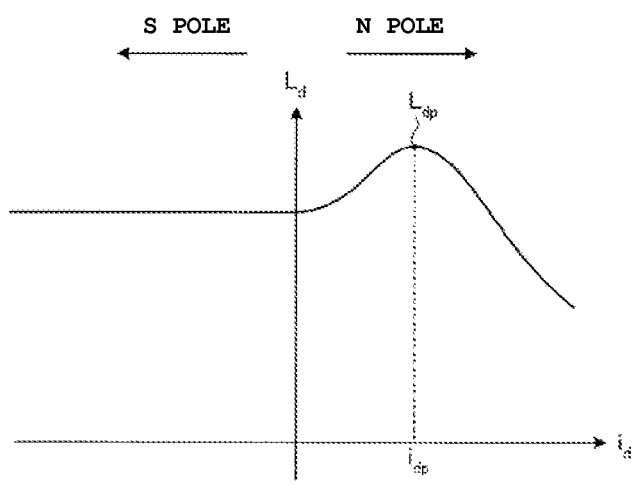
FIG. 4 is a diagram explaining the d-axis inductance characteristic for the permanent magnet synchronous motor of the first embodiment.

Also, FIG. 4 is a diagram explaining the d-axis inductance characteristic for the permanent magnet synchronous motor disclosed in the first embodiment.

In general, for an interior permanent magnet synchronous motor (IPMSM), as shown in FIG. 3, the d-axis inductance Ld decreases monotonically along with increase in the d-axis current.

On the other hand, for the permanent magnet synchronous motor of this embodiment, as shown in FIG. 4, the d-axis inductance has a maximum point $L_{dp}$ in the positive direction with respect to the d-axis current. When the d-axis current is further increased from the maximum point $L_{dp}$, the d-axis inductance Ld decreases monotonically.

Figure 5:
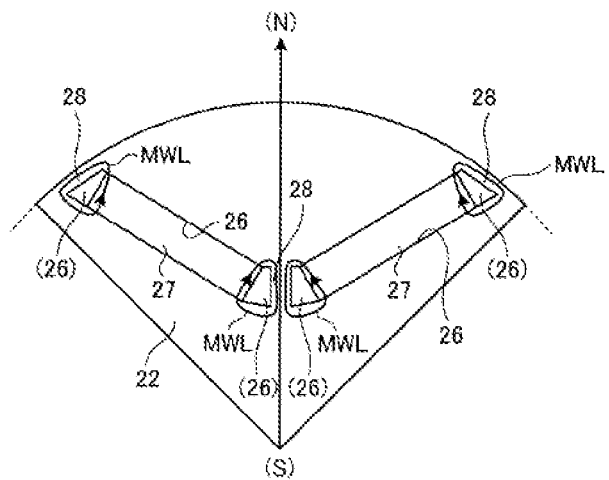
FIG. 5 shows a characteristic of a rotor of the permanent magnet synchronous motor of the first embodiment.

For example, the rotor 22 of the permanent magnet synchronous motor has a rotor core having gaps formed to isolate the magnetic poles from each other as shown in FIG. 5, and at least one permanent magnet is disposed in each gap. When the magnetic poles are formed by these permanent magnets, if iron core parts are included to form a looped local magnetic path in the rotor core, the same characteristic as that shown in FIG. 4 will be obtained.

The reason for having the characteristic shown in FIG. 4 will be explained below.

FIG. 5 shows a characteristic of a rotor of the permanent magnet synchronous motor of the first embodiment.

As shown in FIG. 5, a magnetic flux flows in a loop inside the rotor 22 along a local magnetic path MWL with the aid of the magnetic flux of the magnet. Magnetic saturation occurs in the iron core parts 28 due to the magnetic flux of the magnet. When a positive current flows in the direction of the axis d at that time, the looped magnetic flux in the stator 21 increases, while the looped magnetic flux in the rotor 22 decreases. Therefore, the magnetic saturation of the iron core parts 28 is alleviated, and the d-axis inductance Ld gradually increases.

When the d-axis current is further increased, the magnetic path of the stator core reaches magnetic saturation, and the d-axis inductance Ld decreases. As a result, the characteristic shown in FIG. 4 is obtained.

Figure 6:
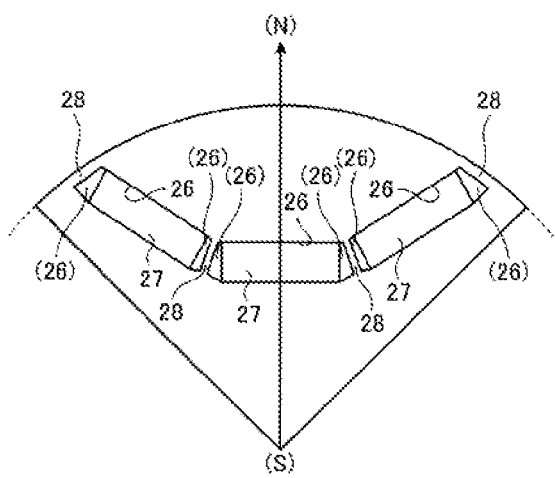
FIG. 6 illustrates an example of another rotor having the same characteristic as the rotor shown in FIG. 4.

FIG. 6 illustrates an example of another rotor having the same characteristic as the rotor shown in FIG. 4.

Since the iron core parts 28 that divide the vertical hole sections (gap sections) 26 also reach magnetic saturation due to the magnetic flux of the magnet having the configuration of the permanent magnets 27 shown in FIG. 6, the characteristic shown in FIG. 4 is displayed in the same way.

Figure 7:
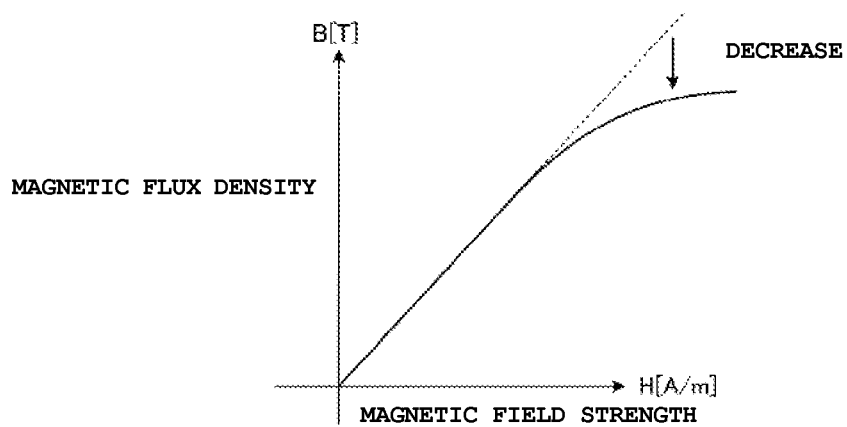
FIG. 7 is a diagram that shows the relationship between magnetic flux density and magnetic field strength.

FIG. 7 is a diagram that shows the relationship between a magnetic flux density (B) and a magnetic field strength (H).

As used herein, magnetic saturation occurs when the magnetic flux density B increases less than linearly with respect to an increase in the magnetic field strength H as shown in FIG. 7.

In other words, since the magnetic flux density B increases less than linearly with respect to the increase in the magnetic field strength H, which increases along with an increase in the current, the inductance is reduced.

The value of d-axis inductance Ld at the maximum point Ldp shown in FIG. 4 is determined as follows.

Figure 8:
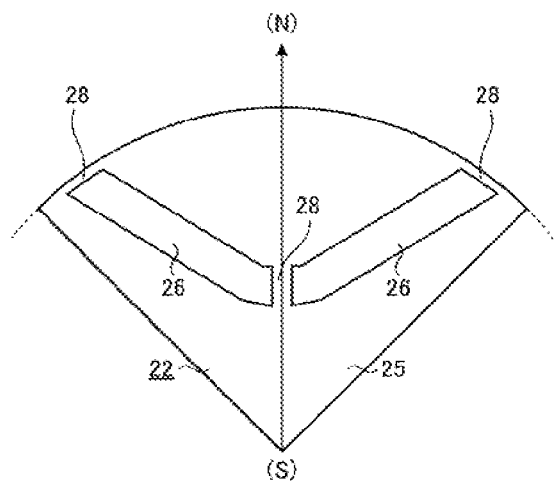
FIG. 8 shows components on the rotor side to illustrate the operation theory of the first embodiment.

FIG. 8 shows components on the rotor side to illustrate the operation theory of the first embodiment.

Figure 9:
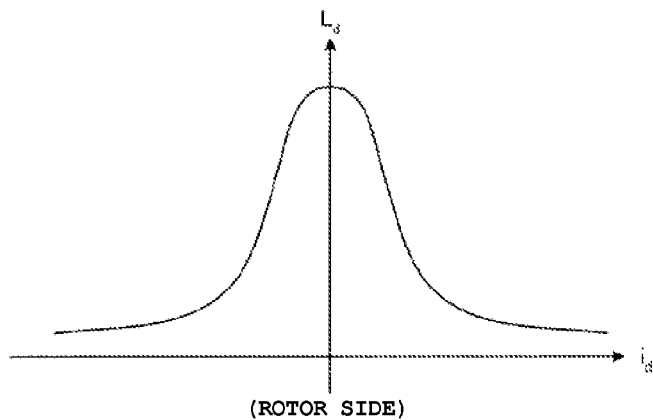
FIG. 9 is a diagram that shows the relationship between the d-axis current and the d-axis inductance on the rotor side shown in FIG. 8.

FIG. 9 is a diagram that shows the relationship between the d-axis current and the d-axis inductance on the rotor side shown in FIG. 8.

First, a motor having no magnet, wherein only the multiple vertical hole sections (gap sections) 26 are disposed at prescribed positions of the rotor core 25 of the rotor 22, is assumed as shown in FIG. 8.

In this case, since the iron core parts 28 that divide the vertical hole sections (gap sections) 26 reach magnetic saturation when the magnetic flux density B is increased, the characteristic of the d-axis inductance Ld on the side of the rotor 22 becomes that shown in FIG. 9.

That is, when the iron core parts 28 that divide the vertical hole sections (gap sections) 26 reach magnetic saturation and the magnetic flux is increased higher than a certain level, the d-axis inductance Ld does not change.

Figure 10:
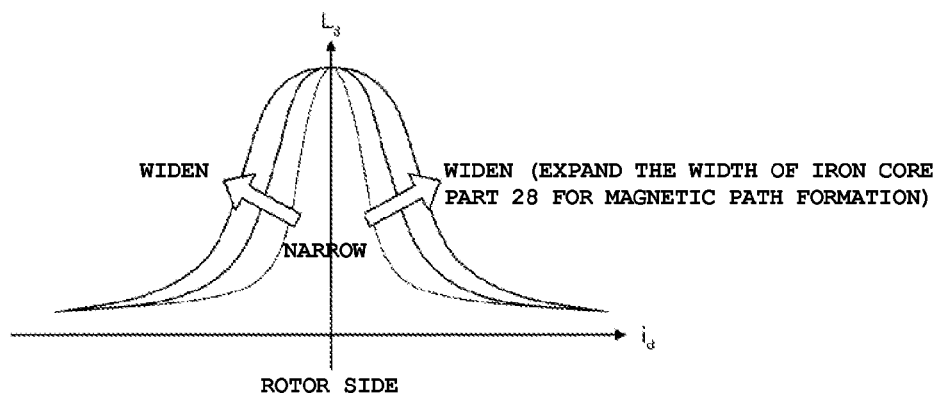
FIG. 10 is a diagram that shows the relationship between the d-axis current and the d-axis inductance on the rotor side when the width of an iron core part for magnetic path formation is widened.

FIG. 10 is a diagram that shows the relationship between the d-axis current and the d-axis inductance on the rotor side when the width of the iron core parts 28 is widened.

In this case, if the width of the iron core parts 28 that divide the vertical hole sections (gap sections) 26 is increased, the magnetic saturation becomes difficult to occur. The area with high d-axis inductance Ld is expanded as shown in FIG. 10.

Figure 11:
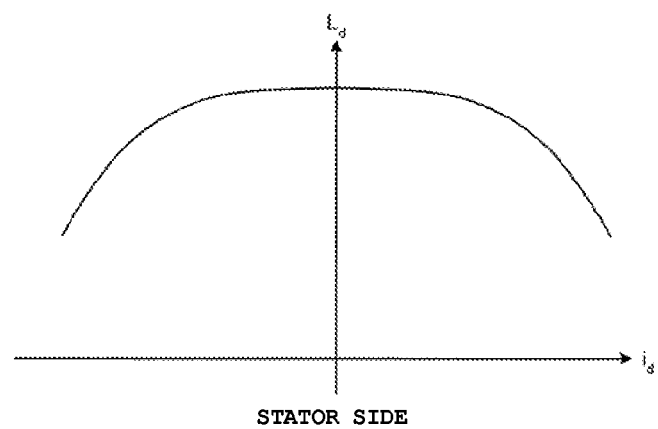
FIG. 11 is a diagram that shows the relationship between the d-axis current and the d-axis inductance on the stator side.

FIG. 11 is a diagram that shows the relationship between the d-axis current and the d-axis inductance on the stator side.

On the stator side, the magnetic saturation occurs slowly, and the d-axis inductance Ld decreases with respect to an increase in the current as shown in FIG. 11. If there is no magnet, as shown in FIGS. 9 and 11, there is no difference in the d-axis inductance Ld between the case when a positive d-axis current id flows and the case when a negative d-axis current id flows.

In the following, the variation in the d-axis inductance Ld in the case when the permanent magnets are added as shown in FIG. 5 will be considered.

Figure 12:
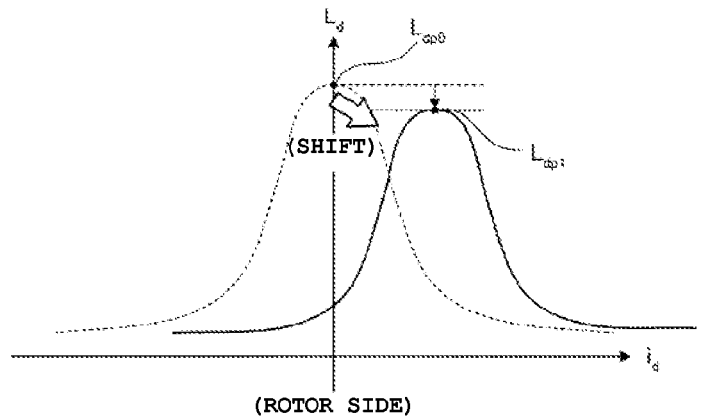
FIG. 12 is a diagram that shows the relationship between the d-axis current and the d-axis inductance on the rotor side when a permanent magnet is inserted into a longitudinal hole.

FIG. 12 is a diagram that shows the relationship between the d-axis current and the d-axis inductance on the rotor side when the permanent magnet is inserted into the longitudinal hole.

When the permanent magnet 27 is inserted into the vertical hole section 26, the magnetic flux that loops inside the rotor 22 flows along the local magnetic path MWL depending on the magnetic flux of the magnet. The iron core parts 28 that divide the vertical hole sections (gap sections) 26 reach magnetic saturation. When the positive d-axis current id flows along the axis d, the magnetic saturation is lessened by the d-axis current id.

Therefore, the characteristic shown in FIG. 9 is shifted in the positive direction of the d-axis current id as shown in FIG. 12. In this case, since the iron core parts 28 of the magnetic path MW of the axis d is somewhat magnetically saturated, a maximum point Ldp1 (<Ldp0) decreases.

Figure 13:
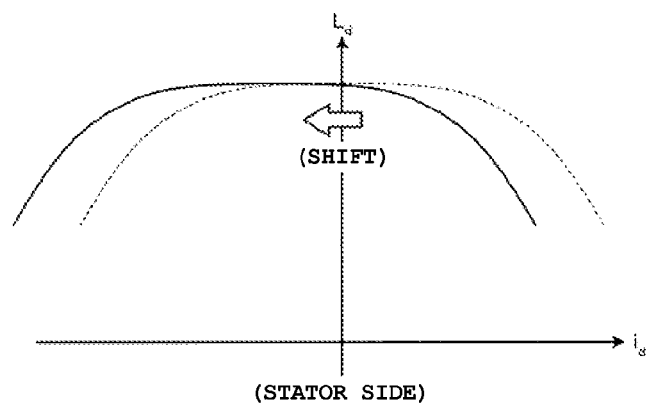
FIG. 13 is a diagram that shows the relationship between the d-axis current and the d-axis inductance on the stator side when the permanent magnet is inserted into the longitudinal hole.

FIG. 13 is a diagram that shows the relationship between the d-axis current and the d-axis inductance on the stator side when the permanent magnet is inserted into the longitudinal hole.

When the permanent magnet 27 is inserted into the vertical hole section 26, magnetic saturation proceeds depending on the magnetic flux of the magnet, and the characteristic of the d-axis inductance Ld shown in FIG. 11 is shifted in the negative direction of the d-axis current id.

Also, the amount of shift of the d-axis current id in the positive direction in FIG. 12 and the amount of shift of the d-axis current in the negative direction in FIG. 13 are determined by the amount of the flux linkage of the d axis.

In FIG. 12, when the amount of the flux linkage generated by the permanent magnet 27 becomes equal to the amount of the flux linkage generated by the d-axis current id, all of the loops of the magnetic flux of the magnet pass through the stator 21. There is no magnetic flux that loops inside the rotor, that is, the magnetic flux that passes through the iron core parts 28 that divide the vertical hole sections (gap section) 26. Since the magnetic saturation of the iron core parts 28 disappears, the d-axis inductance Ld reaches the maximum value.

In FIG. 13, the zero current state of the diagram shifts to the negative direction in accordance with the magnetic flux of the magnet forming a loop in the side of the stator.

In other words, the characteristic obtained by combining both the characteristic on the rotor side and the characteristic on the stator side described above is expressed as the overall characteristic.

Figure 14:
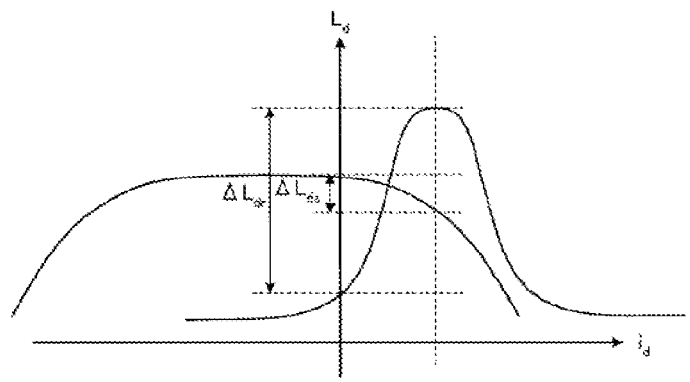
FIG. 14 is a diagram that shows an increase in the amount of the d-axis inductance and a decrease in the amount of the d-axis inductance in the first embodiment.

FIG. 14 is a diagram that shows an increase in the amount of the d-axis inductance and a decrease in the amount of the d-axis inductance in the first embodiment.

Figure 15:
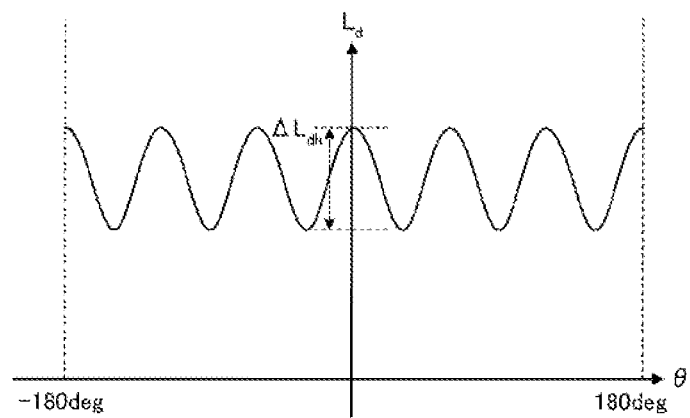
FIG. 15 is a diagram that shows the amount of variation caused by a slot harmonic of the d-axis inductance in the first embodiment.

FIG. 15 is a diagram that shows the amount of variation caused by a slot harmonic of the d-axis inductance in the first embodiment.

A difference in the d-axis inductances Ld needs to be increased in order to enable stable determination of the magnetic polarity. To increase the difference of the d-axis inductances Ld, the rotor 22 and the stator 21 are configured such that the amount of the increased d-axis inductance (ΔLdr in FIG. 14) is sufficiently large compared to the amount of reduced d-axis inductance Ld on the side of the stator 21 (ΔLds in FIG. 14) when the d-axis current id corresponding to the maximum point of the d-axis inductance Ld on the side of the rotor 22 flows.

In particular, if a difference between the increase amount ΔLdr of the d-axis inductance and the decrease amount ΔLds of the d-axis inductance is bigger than the variation amount of the d-axis inductance caused by the slot harmonic (ΔLdh in FIG. 15), it is possible to determine the magnetic polarity stably irrespective of the rotation position of the rotor.

Also, as to be described later, the variation in the d-axis current is used during the operation of the magnetic polarity determination unit 19. As described above, the area with high d-axis inductance near the maximum point of the d-axis inductance is determined by the width of the iron core parts 28 as shown in FIG. 10. In other words, the width of the iron core parts 28 is configured such that the d-axis inductance Ld does not change significantly with respect to the variations in the d-axis current id during operation of the magnetic polarity determination unit 19.

In the following, the operation of the magnetic polarity determination unit 19 will be explained.

The related technology takes advantage of the characteristic that the d-axis inductance Ld decreases monotonically with respect to an increase in the d-axis id as shown in FIG. 3. For example, positive and negative biases are applied to the d-axis current, and the direction in which the amount of variation in the high-frequency current (corresponding to the reciprocal of the d-axis inductance) increases (the direction in which the d-axis inductance decreases) is determined as the N pole.

On the other hand, the permanent magnet synchronous motor 20 of this embodiment has the maximum point Ldp in the N-pole direction as shown in FIG. 4.

Figure 16:
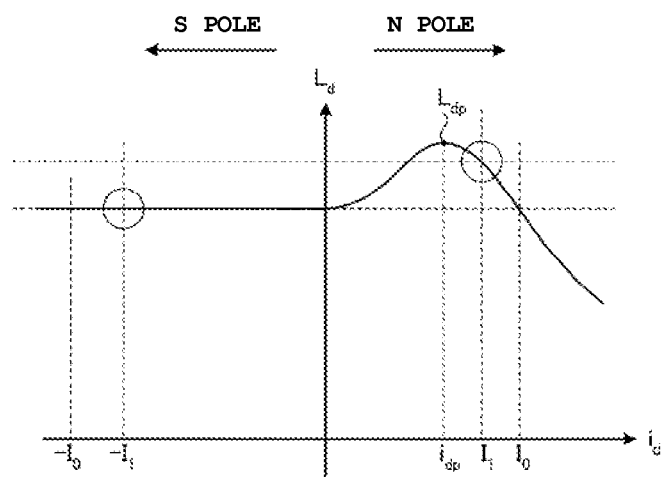
FIG. 16 is a diagram illustrating the magnetic polarity determination operation in the first embodiment.

FIG. 16 is a diagram illustrating the magnetic polarity determination operation in the first embodiment.

In this case, a current value (current amplitude) where the inductance is the same with the positive d-axis current and the negative d-axis current having the same absolute value flowing on the axis d as shown in FIG. 16 is defined as I0.

Then, a current satisfying I1 <I0 is caused to flow in the positive and negative directions. Since the d-axis inductance Ld is bigger on the N-pole side than on the S-pole side as shown in FIG. 16, the magnetic polarity determination unit 19 determines the direction with the bigger d-axis inductance Ld as the N pole. In this way, it is possible to determine the magnetic polarity even for a permanent magnet synchronous motor whose d-axis inductance Ld has a maximum point in the positive direction with respect to the d-axis current and decreases monotonically as the d-axis current is increased from the maximum point as shown in FIG. 4.

Since the d-axis current id must be equal to or bigger than the current value I0 in the case of using the related technology taking advantage of the characteristic that the d-axis inductance decreases monotonically, in this embodiment, it is possible to determine the polarity using a smaller current (=I1 <I0).

Consequently, even in the case of determining the polarity when the motor is started, since the current flowing in the permanent magnet synchronous motor can be reduced, it is possible to reduce the noises and reduce the torque shock when determining the polarity.

Figures 20A, 20B:
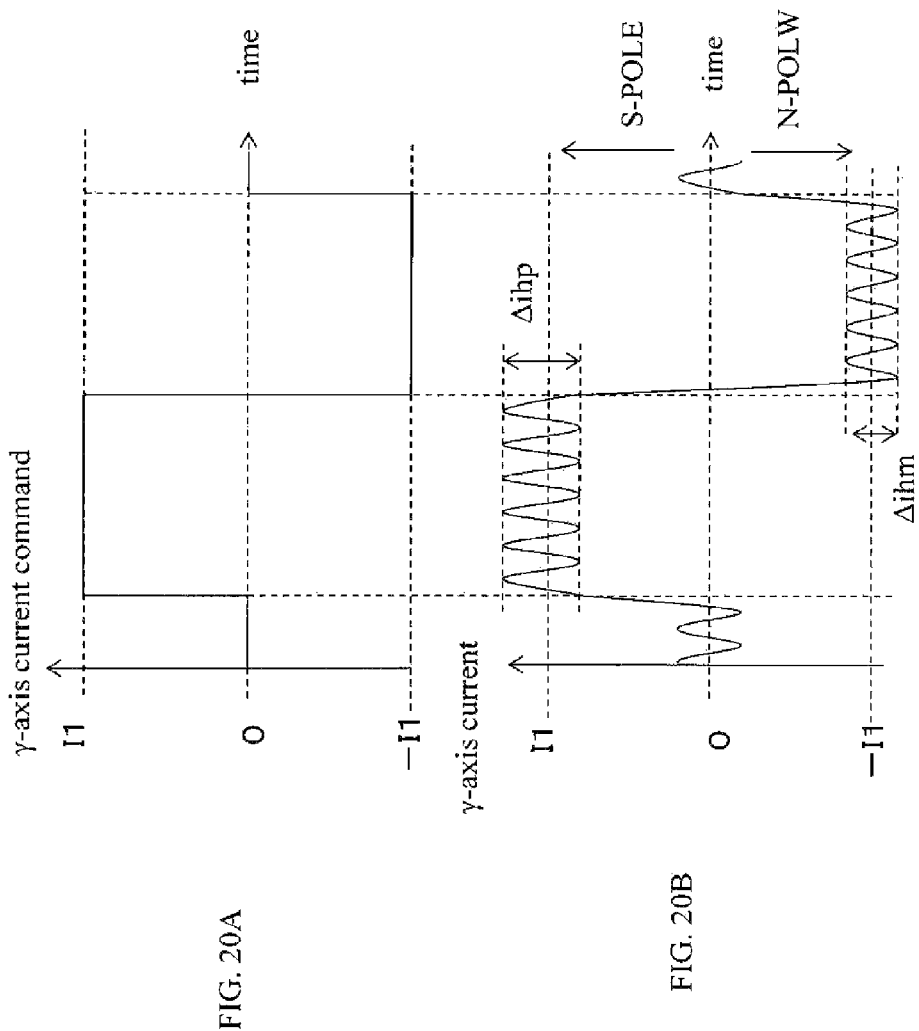
FIGS. 20A and 20B are diagrams illustrating another example of the magnetic polarity determination operation.

Specifically, for example, as shown in FIG. 20A, positive and negative biases (I1 ≤I0) are applied, by the current command generating unit 10, to the γ-axis current. A δ-axis current is set to 0. In this case, the high-frequency voltage command signals vγh, vδh, generated by the high-frequency voltage superimposition unit 12, are superimposed on the voltage command signals vγ0, vδ0 respectively, and consequently the voltage command signals vγ, vδ are generated. As a result, a γ-axis current shown in FIG. 20B is supplied to the permanent magnet synchronous motor 20. Since the variation in the high-frequency current corresponds to the reciprocal of the d-axis inductance, one of a variation in the high-frequency current Δihp, obtained by superimposing a positive bias, and a variation in the high-frequency current Δihm, obtained by superimposing a negative bias, having a larger value is determined as a direction indicating the S-pole direction. In the example of FIGS. 20A and 20B, the Δihp is larger than the Δihm. In this case, the positive direction corresponds to the S-pole direction, the magnetic polarity is reversed. In particular, as shown in FIG. 16, if the d-axis current id during polarity determination, that is, I1 is set equal to idp, the difference between the positive and negative inductances is maximized so that the SN ratio for polarity determination can be increased.

Next, another example will be explained. In this example, the current control unit 11 and the high-frequency voltage superimposition unit 12 are removed from FIG. 1, and the current command generating unit 10 generates the fundamental voltage command signals vγ0, vδ0 without using the magnetic flux current component signal iγ and the torque current component signal iδ.

Figure 17A:
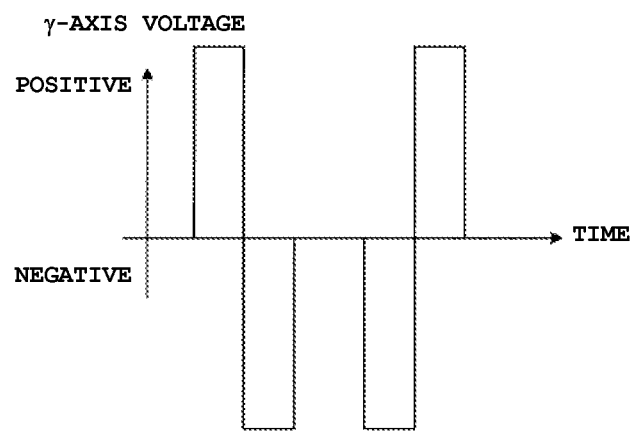
FIGS. 17A and 17B are diagrams illustrating another example of the magnetic polarity determination operation.
Figure 17B:
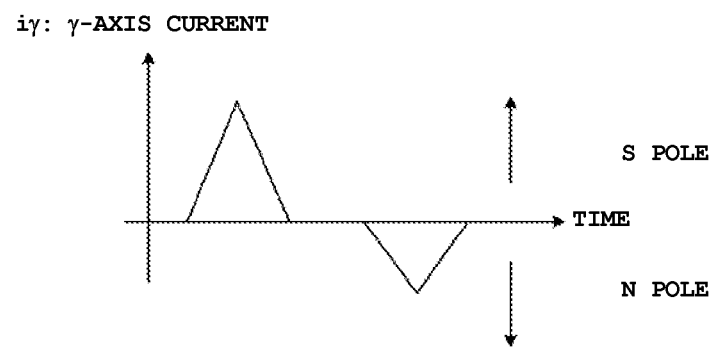

FIGS. 17A and 17B are diagrams illustrating another example of the magnetic polarity determination operation.

As another example of the polarity determination, as shown in FIG. 17A, when certain positive and negative voltages are applied in the γ-axis direction, the amplitude of the γ-axis current appears as shown in FIG. 17B. The direction with the bigger amplitude is determined as the S pole. The amplitude of the γ-axis current corresponds to the reciprocal of the d-axis inductance.

In this case, the voltage amplitude is applied such that the current amplitude I1 in the S-pole direction satisfies I1 <I0. In particular, when the voltage amplitude is applied such that the current amplitude I1 in the S-pole direction becomes equal to I0, the difference of the amplitudes of the d-axis id is maximized so that the SN ratio can be increased.

Alternatively, the amplitude of the γ-axis current iγ is checked when a certain voltage is applied. If it is equal to or bigger than a threshold value, the corresponding direction is determined as the S-pole direction. The voltage amplitude is applied such that the current amplitude I1 in the S-pole direction satisfies I1≤I0. In particular, when the voltage amplitude is applied such that the current amplitude I1 in the S-pole direction becomes equal to I0, the current amplitude is maximized so that the SN ratio can be increased.

It is also possible to adopt an AC voltage generating unit that superimposes an AC voltage that is positively and negatively symmetric with respect to the axis d. The amplitudes of the d-axis current id in the positive and negative directions generated by the AC voltage are detected, and the direction with the bigger current amplitude is determined as the S-pole direction.

In this case, the voltage amplitude is applied such that the current amplitude I1 in the S-pole direction satisfies I1≤I0. In particular, when the voltage amplitude is applied such that the current amplitude I1 in the S-pole direction becomes equal to I0, the difference of the current amplitudes is maximized so that the SN ratio can be increased.

It is also possible to determine the magnetic pole direction in the same way based on the fact that the d-axis inductance on the N-pole side increases in the area of id<I0.

The magnetic pole position estimating unit 18 and the magnetic polarity determination unit 19 are constituted separately as described above. However, it is also possible to integrate them. For example, it is possible to estimate the magnetic pole position including determination of the magnetic polarity by adopting a method that estimates the magnetic pole position based on the fact that the characteristic of magnetic saturation becomes different positively and negatively only in the d-axis direction when a positively and negatively symmetric d-axis current flows. In this case, the current amplitude is set appropriately to satisfy I1≤I0. The same effect as that of the embodiment described above can be obtained based on the fact that the d-axis inductance on the N-pole side increases.

The sensorless control has been explained above. This embodiment, however, can be applied in the same way for estimating the initial magnetic pole position of a pulse generator.

(Second Embodiment)

The second embodiment is different from the first embodiment. In this case, the polarity is determined by flowing a current of I1>I0 in the positive and negative directions in a permanent magnet synchronous motor whose d-axis inductance has a maximum point in the positive direction with respect to the d-axis current id and decreases monotonically as the d-axis current is increased from the maximum point as shown in FIG. 4.

Figure 18:
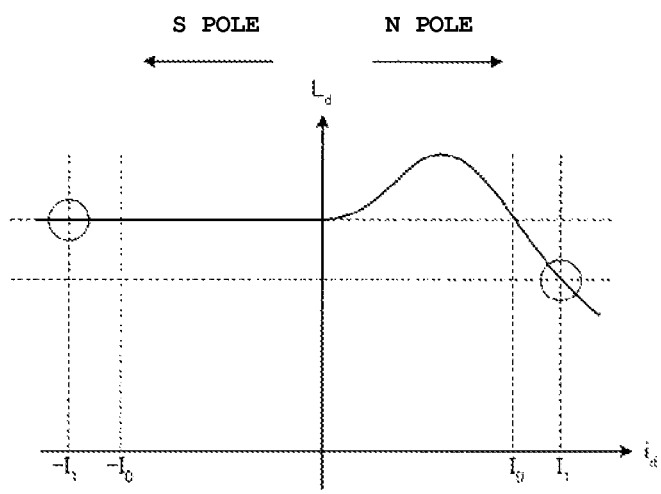
FIG. 18 is a diagram illustrating the magnetic polarity determination operation in a second embodiment.

FIG. 18 is a diagram illustrating the magnetic polarity determination operation in the second embodiment.

In this case, as shown in FIG. 18, since the d-axis inductance Ld decreases more on the N-pole side than on the S-pole side, the magnetic polarity determination unit 19 determines the direction with smaller d-axis inductance Ld as the N-pole direction.

In this case, unlike the first embodiment, since the difference in the d-axis inductance Ld between the N-pole side and the S-pole side increases as the d-axis current id is increased, it is easy to make adjustment and guarantee the SN ratio.

Specifically, for example, positive and negative biases (I1>I0) are applied to the d-axis current, and the direction in which the variation in the high-frequency current (corresponding to the reciprocal of the d-axis inductance) increases (the direction in which the d-axis inductance decreases) is determined as the N pole.

The magnetic pole direction may be determined in the same way by taking advantage of the fact that the d-axis inductance on the S-pole side increases in the area of id>I0.

The magnetic pole position estimating unit 18 and the magnetic polarity determination unit 19 are constituted separately as described above. However, it is also possible to integrate them. For example, it is possible to estimate the magnetic pole position including determination of the magnetic polarity by adopting a method that estimates the magnetic pole position based on the fact that the characteristic of magnetic saturation becomes different positively and negatively only in the d-axis direction when a positively and negatively symmetric d-axis current flows.

In this case, the current amplitude is set appropriately to satisfy I1>I0. The same effect of the present embodiment can be obtained based on the fact that the d-axis inductance on the S-pole side increases.

The second embodiment is not limited to the sensorless control, either. This embodiment may be also applied in the same way for estimating the initial magnetic pole position of the pulse generator.

(Third Embodiment)

In each embodiment described above, only the case when the permanent magnet synchronous motor connected as the control object has the characteristic shown in FIG. 4 has been explained. In the third embodiment, it is possible to choose the case when the permanent magnet synchronous motor connected as the control object has the characteristic shown in FIG. 3 or the case when the permanent magnet synchronous motor has the characteristic shown in FIG. 4.

Only a magnetic polarity determination unit that is different from the first embodiment will be explained below.

Figure 19:
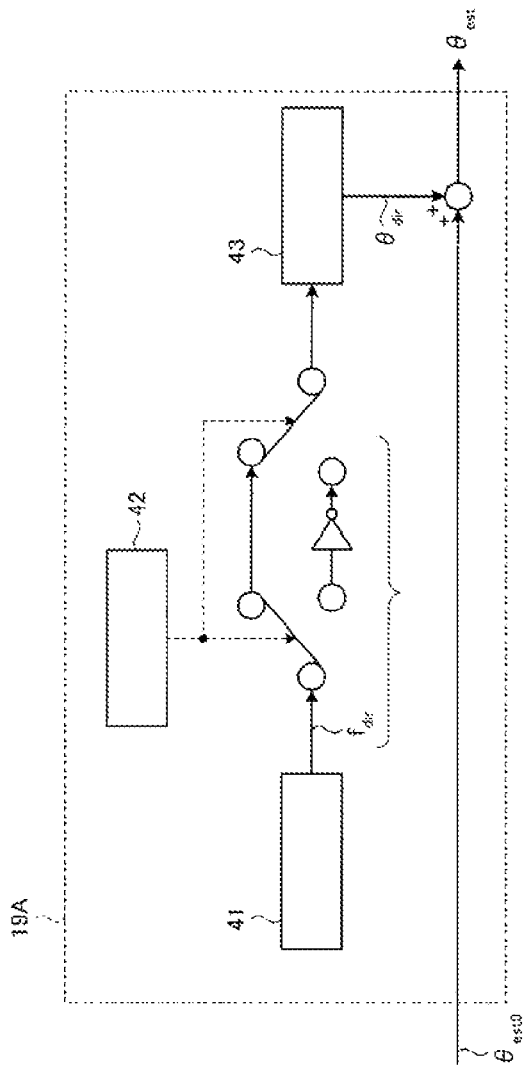
FIG. 19 is a block diagram illustrating a magnetic polarity determination unit according to a third embodiment.

FIG. 19 is a block diagram illustrating a magnetic polarity determination unit according to the third embodiment.

A magnetic polarity determination unit 19A of the third embodiment is used instead of the magnetic polarity determination unit 19 in the first embodiment. As shown in FIG. 19, this magnetic polarity determination unit includes a polarity determination unit 41, a determination method selecting unit 42, and a polarity inverting unit 43.

The polarity determination unit 41 of the magnetic polarity determination unit 19A determines the direction in which the inductance increases when the positive and negative current 11 flows along the axis d as the S pole and sets a polarity determination flag fdir. Specifically, for example, positive and negative biases are applied to the d-axis current, and the direction in which the variation in the high-frequency current (corresponding to the reciprocal of the d-axis inductance) decreases (the direction in which the d-axis inductance increases) is determined as the S pole.

The determination method selecting unit 42 inverts the polarity determination flag fdir when the connecting motor is the permanent magnet synchronous motor whose d-axis inductance has a maximum point in the positive direction with respect to the d-axis current and decreases monotonically as the d-axis current is increased from the maximum point and I1<I0.

In this way, the polarity inverting unit 43 can determine whether to invert the polarity based on fdir. If it is necessary to invert, 180° (deg) is output to a polarity inversion command θdir to invert the polarity of the estimated magnetic pole position θest0, and the result obtained after the inversion is output as the polarity-attached magnetic pole position θest.

According to the third embodiment, for both the permanent magnet synchronous motor having the characteristic that the d-axis inductance decreases monotonically along with increase in the d-axis current as shown in FIG. 3 and the permanent magnet synchronous motor having the characteristic that the d-axis inductance has a maximum point in the positive direction with respect to the d-axis current and decreases monotonically as the d-axis current is increased from the maximum point as shown in FIG. 4, the user can simply set the determination method selecting unit 42 to realize a magnetic polarity determination device, eventually, a motor control device that is the most suitable for each permanent magnet synchronous motor.

The third embodiment is not limited to the sensorless control, either. This embodiment can also be applied in the same way for estimating the initial magnetic pole position of the pulse generator.

(Other Embodiments)

(4.1) First Other Embodiment

A magnetic polarity determination device disclosed in a first other embodiment is used to determine the magnetic polarity of a permanent magnet synchronous motor having the following characteristic. The relationship between the inductance and a current in the magnetic pole direction is defined such that the current direction that increases a magnetic flux of a magnet is the positive direction, while the current direction that decreases the magnetic flux of the magnet is the negative direction. The inductance has a maximum point when the current flows in the positive direction. When a big current flows in the positive direction from the maximum point, the inductance in the magnetic pole direction decreases monotonically. This magnetic polarity determination device is equipped with a magnetic polarity determination unit that determines the N-pole side as the side where the inductance in the magnetic pole direction (d-axis inductance) increases when currents with the same prescribed current value flow in the positive direction and the negative direction.

(4.2) Second Other Embodiment

A second other embodiment relates to a magnetic polarity determination device used for determining the magnetic polarity of a permanent magnet synchronous motor that includes a rotor core with a gap formed such that there is isolation between the magnetic poles and includes at least one permanent magnet disposed in the gap and includes an iron core part for magnetic path formation used for forming a local magnetic path that forms a loop inside the rotor core when the magnetic poles are formed by the permanent magnet. The relationship between the inductance and a current in the magnetic pole direction is determined such that the direction of the current increasing a magnetic flux of a magnet is set as the positive direction, while the direction of the current decreasing the magnetic flux of the magnet is set as the negative direction. This magnetic polarity determination device includes a magnetic polarity determination unit that determines, as the N-pole side, the side where the inductance in the magnetic pole direction (d-axis inductance) increases when currents with the same prescribed current value flow in the positive direction and the negative direction.

(4.3) Third Other Embodiment

According to a third other embodiment, in the first or second other embodiment, the prescribed current value (I1) is set smaller than a current value when the inductances in the magnetic pole direction become equal again in the positive and negative directions in the case when currents with the same current value flow in the positive and negative directions from the state when the current value is zero and the current is increased to exceed a current value corresponding to the maximum point in the positive direction.

(4.4) Fourth Other Embodiment

According to a fourth other embodiment, in any of the first to the third other embodiments, the prescribed current value is set to the current value corresponding to the maximum point or a current value corresponding to the vicinity of the maximum point.

(4.5) Fifth Other Embodiment

According to a fifth other embodiment, in any of the first to the fourth other embodiments, the prescribed current value is set such that the difference of the inductances in the magnetic pole direction at the prescribed current value is equal to or bigger than a prescribed difference.

(4.6) Sixth Other Embodiment

According to a sixth other embodiment, the magnetic polarity determination device disclosed in any of the first to the fifth other embodiments can be connected to either the permanent magnet synchronous motor having the characteristic that the inductance in the magnetic pole direction monotonically decreases when a big current flows in the positive direction from the maximum point or another permanent magnet synchronous motor having the characteristic that the inductance in the magnetic pole direction monotonically decreases along with increase in the current value when the current flows in the positive direction. This magnetic polarity determination device is equipped with a polarity reversing unit that can reverse the output of the magnetic polarity determination unit when the other permanent magnet synchronous motor is connected.

(4.7) Seventh Other Embodiment

A seventh other embodiment relates to a magnetic polarity determination device used for determining the magnetic polarity of a permanent magnet synchronous motor having the following characteristic: the relationship between the inductance in the magnetic pole direction and a current is determined such that the direction of the current increasing a magnetic flux of a magnet is set as the positive direction, while the direction of the current decreasing the magnetic flux of the magnet is set as the negative direction; when a positive-direction current flows, there is a maximum point of the inductance; when a big current flows in the positive direction from the maximum point, the inductance in the magnetic pole direction monotonically decreases. A current value bigger than a current value when the inductances in the magnetic pole direction becomes equal again in the positive and negative directions in the case when the same current flow in the positive and negative directions from the state when the current is zero and the current is increased to exceed a current value corresponding to the maximum point in the positive direction is used as a prescribed current value. This magnetic polarity determination device is equipped with a magnetic polarity determination unit that determines the N-pole side as the side where the inductance in the magnetic pole direction decreases when currents with the same prescribed current value flow in the positive direction and the negative direction.

(4.8) Eighth Other Embodiment

An eighth other embodiment relates to a magnetic polarity determination device used for determining the magnetic polarity of a permanent magnet synchronous motor having the following characteristic: the relationship between the inductance in the magnetic pole direction and a current is determined such that the direction of the current increasing a magnetic flux of a magnet is set as the positive direction, while the direction of the current decreasing the magnetic flux of the magnet is set as the negative direction; when a positive-direction current flows, there is a maximum point of the inductance; when a big current flows in the positive direction from the maximum point, the inductance in the magnetic pole direction monotonically decreases. This magnetic polarity determination device is equipped with an AC voltage generating unit that superimposes AC voltages that are positively and negatively symmetric in the magnetic pole direction and a magnetic polarity determination unit that detects the amplitude in the positive direction and the amplitude in the negative direction of the current generated by the AC voltage and determines the direction with bigger current amplitude as the S-pole side.

(4.9) Ninth Other Embodiment

A ninth other embodiment relates to a permanent magnet synchronous motor control device used for controlling a permanent magnet synchronous motor having the following characteristic: the relationship between the inductance in the magnetic pole direction and a current is determined such that the direction of the current increasing a magnetic flux of a magnet is set as the positive direction, while the direction of the current decreasing the magnetic flux of the magnet is set as the negative direction; when a positive-direction current flows, there is a maximum point of the inductance; when a big current flows in the positive direction from the maximum point, the inductance in the magnetic pole direction monotonically decreases. This permanent magnet synchronous motor control device includes a magnetic polarity determination unit that determines the N-pole side as the side where the inductance in the magnetic pole direction increases when currents with the same prescribed current value flow in the positive direction and the negative direction and an inverter control unit that generates a gate command signal based on the determination result of the magnetic polarity determination unit to control an inverter that drives the permanent magnet synchronous motor.

(4.10) Tenth Other Embodiment

A tenth other embodiment relates to a permanent magnet synchronous motor control device used for controlling a permanent magnet synchronous motor that has a rotor core with a gap formed such that there is isolation between the magnetic poles and has at least one permanent magnet disposed in the gap and has an iron core part for magnetic path formation used for forming a local magnetic path that forms a loop inside the rotor core when the magnetic poles are formed by the permanent magnet. The relationship between the inductance in the magnetic pole direction and a current is determined such that the direction of the current increasing a magnetic flux of a magnet is set as the positive direction, while the direction of the current decreasing the magnetic flux of the magnet is set as the negative direction. This control device is equipped with a magnetic polarity determination unit that determines the N-pole side as the side where the inductance in the magnetic pole direction increases when currents with the same prescribed current value flow in the positive direction and the negative direction and an inverter control unit that generates a gate command signal based on the determination result of the magnetic polarity determination unit to control an inverter that drives the permanent magnet synchronous motor.

(4.11) Eleventh Other Embodiment

An eleventh other embodiment relates to a magnetic polarity determination method implemented by a magnetic polarity determination device used for determining the magnetic polarity of a permanent magnet synchronous motor having the following characteristic: the relationship between the inductance in the magnetic pole direction and a current is determined such that the direction of the current increasing a magnetic flux of a magnet is set as the positive direction, while the direction of the current decreasing the magnetic flux of the magnet is set as the negative direction; when a positive-direction current flows, there is a maximum point of the inductance; when a big current flows in the positive direction from the maximum point, the inductance in the magnetic pole direction monotonically decreases. This magnetic polarity determination method has a step of flowing currents with the same prescribed current value in the positive direction and the negative direction and a magnetic polarity determination step that determines the N-pole side as the side where the inductance in the magnetic pole direction increases when currents flow at the same prescribed current value.

(4.12) Twelfth Other Embodiment

A twelfth other embodiment relates to a magnetic polarity determination device used for determining the magnetic polarity of a permanent magnet synchronous motor that has a rotor core with a gap formed such that there is isolation between the magnetic poles, and has at least one permanent magnet disposed in the gap and has an iron core part for magnetic path formation used for forming a local magnetic path that forms a loop inside the rotor core when the magnetic poles are formed by the permanent magnet; the relationship between the inductance in the magnetic pole direction and a current is determined such that the direction of the current increasing a magnetic flux of a magnet is set as the positive direction, while the direction of the current decreasing the magnetic flux of the magnet is set as the negative direction; This magnetic polarity determination method has a step of flowing currents with the same prescribed current value in the positive direction and the negative direction and a magnetic polarity determination step that determines the N-pole side as the side where the inductance in the magnetic pole direction increases when currents flow at the same prescribed current value.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A control system for controlling a synchronous motor having a magnet in a rotor, the control system comprising:
an inverter configured to output an AC current for driving the synchronous motor;
a gate command generating unit configured to generate a gate command for controlling the inverter;
a current detecting unit configured to detect the AC current output by the inverter;
a magnetic pole position estimating unit configured to estimate a magnetic pole position based on the AC current detected by the current detecting unit and generate an estimation signal;
a current command generating unit configured to generate a current command and an estimation command for controlling the inverter to output the AC current with a predetermined level, wherein the estimation command is generated when estimating the magnetic pole position; and
a magnetic polarity determination unit configured to calculate, based on the estimation signal, first data indicating an inductance value based on a positive d-axis current and second data indicating an inductance value based on a negative d-axis current, compare the first data and the second data, and determine one of the first data and the second data having a larger value as indicating an N-pole direction;

wherein the synchronous motor has a characteristic that: i) a d-axis inductance has a local maximum point within a range in which the positive d-axis current increases when the positive d-axis current is supplied to a stator, ii) a d-axis inductance in magnetic flux direction monotonically decreases when the positive d-axis current is increased beyond the local maximum point, and iii) the value of the local maximum point is greater than a value of the d-axis inductance when the negative d-axis current is supplied to the stator.

2. The control system according to claim 1, wherein the estimation command is a command for controlling the inverter so that an inductance value, obtained by a d-axis component of the AC current output by the inverter, becomes a maximum value.

3. The control system according to claim 1, wherein the rotor has a plurality of magnet portions, each including two magnets arranged so that a distance between the two magnets shortens at sections nearer the center of the rotor.

4. The control system according to claim 3, wherein the two magnets in one of the magnet portions is arranged across a d-axis.

5. The control system according to claim 1, wherein the rotor has a plurality of magnet portions, each including three magnets, two of which are arranged so that a distance between the two magnets shortens at sections nearer the center of the rotor.

6. The control system of claim 1, wherein the gate command generating unit comprises:
   a high-frequency voltage superposition unit configured to superimpose first voltage command signals with fundamental voltage command signals to generate second voltage command signals;
   a coordinate converting unit configured to convert the second voltage command signals to third voltage command signals based on the estimated magnetic pole position; and
   a modulation unit configured to generate the gate command based on the third voltage command signals.

7. A control system for controlling a synchronous motor having a magnet in a rotor, the control system comprising:
   an inverter configured to output an AC current for driving the synchronous motor; a gate command generating unit configured to generate a gate command for controlling the inverter;
   a current detecting unit configured to detect the AC current output by the inverter; a magnetic pole position estimating unit configured to estimate a magnetic pole position based on the AC current detected by the current detecting unit and generate an estimation signal;
   a current command generating unit configured to generate a current command and an estimation command for controlling the inverter to output the AC current with a predetermined level, wherein the estimation command is generated when estimating the magnetic pole position; and
   a magnetic polarity determination unit configured to calculate, based on the estimation signal, fist data indicating an inductance value based on a positive d-axis current and second data indicating an inductance value based on a negative d-axis current, compare the first data and the second data, and determine one of the first data and the second data having a smaller value as indicating an N-pole direction,
   wherein the estimation command controls the inverter to output an AC current larger value than a first AC current that causes an inductance value to be a maximum value and a second AC current that causes the same inductance value when outputting a positive second AC current and a negative second AC current;
   wherein the synchronous motor has a characteristic that: i) a d-axis inductance has a local maximum point within a range in which the positive d-axis current increases when the positive d-axis current is supplied to a stator, ii) a d-axis inductance in magnetic flux direction monotonically decreases when the positive d-axis current is increased beyond the local maximum point, and iii) the value of the local maximum point is greater than a value of the d-axis inductance when the negative d-axis current is supplied to the stator.

8. A control system for controlling a synchronous motor having a magnet in a rotor, the control system comprising:
   an inverter configured to output an AC current for driving the synchronous motor;
   a gate command generating unit configured to generate a gate command for controlling the inverter;
   a current detecting unit configured to detect the AC current output by the inverter;
   a magnetic pole position estimating unit configured to estimate a magnetic pole position based on the AC current detected by the current detecting unit and generate an estimation signal;
   an AC voltage generating unit configured to generate an AC voltage to be superimposed on a d-axis component of the AC current output by the inverter; and
   a magnetic polarity determination unit configured to determine an S-pole direction based on an amplitude of the d-axis component on which the AC voltage generated by the AC voltage generating unit is superimposed;
   wherein the synchronous motor has a characteristic that: i) a d-axis inductance has a local maximum point within a range in which a positive d-axis current increases when the positive d-axis current is supplied to a stator, ii) a d-axis inductance in magnetic flux direction monotonically decreases when the positive d-axis current is increased beyond the local maximum point, and iii) the value of the local maximum point is greater than a value of the d-axis inductance when a negative d-axis current is supplied to the stator.

* * * * *